(12) United States Patent
Kwon et al.

(10) Patent No.: US 9,905,612 B2
(45) Date of Patent: Feb. 27, 2018

(54) DISPLAY DEVICE AND METHOD FOR MANUFACTURING THE SAME

(71) Applicant: SAMSUNG DISPLAY CO., LTD., Yongin, Gyeonggi-Do (KR)

(72) Inventors: So Ra Kwon, Cheonan-si (KR); Jae Kyung Go, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 10 days.

(21) Appl. No.: 14/688,983

(22) Filed: Apr. 16, 2015

(65) Prior Publication Data

US 2016/0035761 A1 Feb. 4, 2016

(30) Foreign Application Priority Data

Aug. 1, 2014 (KR) ........................ 10-2014-0099237

(51) Int. Cl.
*H01L 27/12* (2006.01)
*H01L 27/24* (2006.01)

(52) U.S. Cl.
CPC ........ *H01L 27/2418* (2013.01); *H01L 27/124* (2013.01)

(58) Field of Classification Search
CPC ........................ H01L 27/3244; H01L 51/5203
USPC .......................................................... 257/40
See application file for complete search history.

(56) References Cited

U.S. PATENT DOCUMENTS

| | | | |
|---|---|---|---|
| 2005/0029936 A1* | 2/2005 | Kim | H01L 27/3244 313/506 |
| 2007/0187759 A1* | 8/2007 | Lee | H01L 51/56 257/347 |
| 2013/0069853 A1 | 3/2013 | Choi | |
| 2014/0117342 A1* | 5/2014 | Kwon | H01L 27/3244 257/40 |

FOREIGN PATENT DOCUMENTS

| | | |
|---|---|---|
| KR | 10-2011-0070565 A | 6/2011 |
| KR | 10-2013-0031101 A | 3/2013 |
| KR | 10-2013-0107050 A | 10/2013 |

* cited by examiner

*Primary Examiner* — Tran Tran
(74) *Attorney, Agent, or Firm* — Lewis Rocca Rothgerber Christie LLP

(57) ABSTRACT

A display device including a substrate including a display area and a non-display area, a common electrode line in the non-display area, and a protective layer coating at least a part of an end portion of the common electrode line.

20 Claims, 14 Drawing Sheets

DISPLAY DEVICE AND METHOD FOR MANUFACTURING THE SAME

CROSS-REFERENCE TO RELATED APPLICATION

This application claims priority to and the benefit of Korean Patent Application No. 10-2014-0099237, filed on Aug. 1, 2014, with the Korean Intellectual Property Office, the disclosure of which is incorporated herein in its entirety by reference.

BACKGROUND

1. Field

Embodiments of the present invention relate to a display device and a method for manufacturing the same.

2. Description of the Related Art

Flat panel displays such as liquid crystal displays (LCDs) and organic light-emitting diode (OLED) displays include a pair of electric field generating electrodes and an electro-optical active layer interposed therebetween. A liquid crystal layer is included as the electro-optical active layer in LCDs and an organic emission layer is included as the electro-optical active layer in OLED displays.

At least one pixel electrode and at least one counter electrode are used to drive an electro-optical active layer. The pixel electrodes are categorized according to a pixel, and the counter electrodes face the pixel electrodes. The counter electrodes may be replaced with common electrodes that are located for all pixels.

A common electrode line is used to provide the common electrode with power. The common electrode line is usually located outside a display unit where a pixel is located and it is made of a metal having low resistance in order to reduce or prevent IR-drop.

However, a patterning process is repeatedly performed in a manufacturing process of a display device, which results in damage to the common electrode line.

It is to be understood that this background of the technology section is intended to provide useful background for understanding the technology disclosed herein, and, as such, the technology background section may include ideas, concepts or recognitions that were not part of what was known or appreciated by those skilled in the pertinent art prior to corresponding effective filing dates of subject matter disclosed herein.

SUMMARY

Aspects of embodiments of the present invention are directed toward a display device including a protective layer that coats at least part of an end portion of a common electrode line.

Further, aspects of embodiments of the present invention are directed toward a method for manufacturing a display device including a protective layer that coats at least part of an end portion of a common electrode line.

According to an embodiment of the present invention, there is provided a display device including: a substrate including a display area and a non-display area; a common electrode line in the non-display area; and a protective layer coating at least a part of an end portion of the common electrode line.

In an embodiment, the common electrode line includes a metal.

In an embodiment, the display area includes at least one thin film transistor including a gate electrode, a semiconductive layer, a source electrode, and a drain electrode, and wherein the common electrode line includes substantially the same material as the source and drain electrodes.

In an embodiment, the protective layer overlaps with one side-edge of the common electrode line.

In an embodiment, a length of the protective layer is greater than or equal to a length of one side of the display area.

In an embodiment, the protective layer includes a first protective layer and a second protective layer that are separated from each other along a direction of the common electrode line.

In an embodiment, a distance between the first protective layer and the second protective layer is in a range of about 20 μm to about 2000 μm.

In an embodiment, the first protective layer coats at least a part of the end portion of the common electrode line located away from the display area, and the second protective layer does not coat an end portion of the common electrode line, the first and second protective layers being alternately arranged.

In an embodiment, the protective layer has a width in a range of about 20 μm to about 200 μm.

In an embodiment, the display area includes at least one display element including: a pixel electrode on the substrate; a light emission layer on the pixel electrode; and a common electrode on the light emission layer, wherein the common electrode is coupled to the common electrode line.

In an embodiment, display area further includes a planarization layer between the substrate and the pixel electrode, and wherein the protective layer includes substantially the same material as the planarization layer.

In an embodiment, the display device further includes a pixel defining layer on the planarization layer so as to define a pixel area, wherein the pixel electrode and the light emission layer are located in the pixel area.

In an embodiment, the display device further includes a common electrode coupling portion on the planarization layer, the common electrode coupling portion being coupled to the common electrode line.

In an embodiment, the common electrode coupling portion includes substantially the same material as the pixel electrode.

According to an embodiment of the present invention, there is provided a method for manufacturing a display device, the method including: forming a display area and a non-display area on a substrate; forming a common electrode line in the non-display area on the substrate; and forming a protective layer covering at least a part of an end portion of the common electrode line.

In an embodiment, the forming of the display area includes forming a thin film transistor on the substrate, and the forming of the thin film transistor includes: forming a semiconductive layer; forming a gate electrode overlapping the semiconductive layer at least in part; forming a source electrode coupled to the semiconductive layer; and forming a drain electrode separated from the source electrode and coupled to the semiconductive layer, wherein the forming of the source and drain electrodes is performed utilizing substantially the same process as the forming of the common electrode line.

In an embodiment, the method further includes forming a planarization layer on the thin film transistor after the forming of the thin film transistor, wherein the forming of the planarization layer is performed utilizing substantially the same process as the forming of the protective layer.

In an embodiment, the forming of the planarization layer includes: forming a material layer for the planarization layer by applying a planarization layer-forming material on the thin film transistor; selectively exposing the material layer for the planarization layer to light; and developing the exposed material layer for the planarization layer.

In an embodiment, the forming of the display area includes forming one or more display elements, wherein the forming of the display element includes: forming a pixel electrode on the substrate; forming a light emission layer on the pixel electrode; and forming a common electrode on the light emission layer, wherein the common electrode is coupled to the common electrode line.

In an embodiment, the forming of the pixel electrode includes forming a common electrode coupling portion coupled to the common electrode line.

In an embodiment, the method further includes forming a pixel defining layer on the substrate after the forming of the pixel electrode and before the forming of the light emission layer.

In an embodiment, the protective layer covers one side-edge of the common electrode line.

In an embodiment, the forming of the protective layer includes forming a first protective layer and a second protective layer separated from each other.

In an embodiment, the distance between the one or more protective layers is in a range of about 20 µm to about 2000 µm.

In an embodiment, the forming of the protective layer includes forming a first protective layer covering at least a part of the end portion of the common electrode line, and forming a second protective layer not covering the end portion of the common electrode line, the first and second protective layers being alternately arranged.

In an embodiment, the protective layer has a width in a range of about 20 µm to about 200 µm.

According to embodiments of the present invention, a display device includes a protective layer that is located on an end portion of a common electrode line. Therefore, when a layer is formed in a manufacturing process of a display device, a layer-forming material may be evenly applied to form a uniform layer.

Further, according to embodiments of the present invention, a display device in which a protective layer is located on an end portion of a common electrode line may be manufactured.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other aspects, features and other enhancements of the present invention will be more clearly understood from the following detailed description when taken in conjunction with the accompanying drawings, in which.

DETAILED DESCRIPTION

Figure 1:
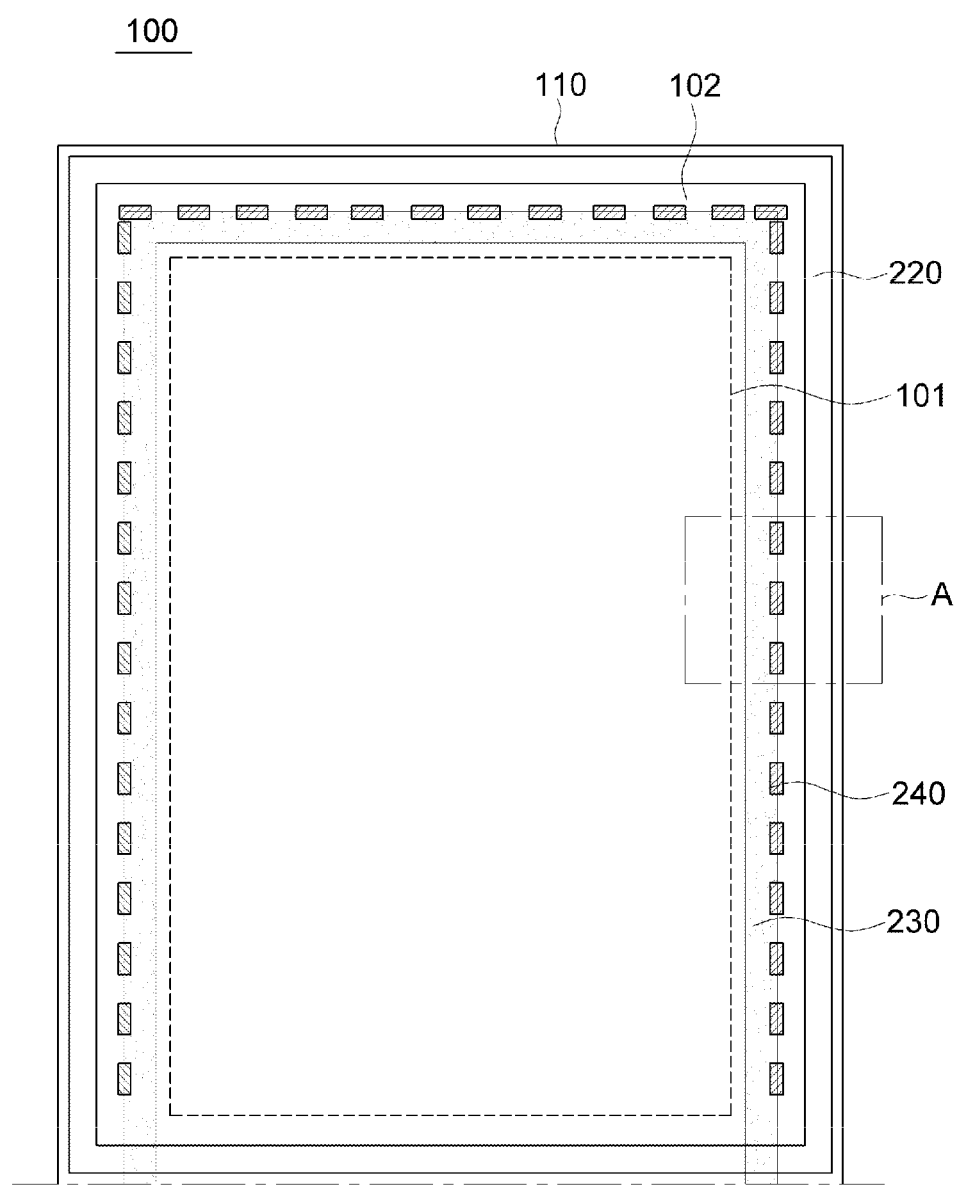
FIG. 1 is a plan view illustrating a display device, according to a first example embodiment of the present invention.

Aspects of the present invention will be described with reference to embodiments illustrated in the drawings. However, the embodiments disclosed in the drawings and the detailed description are not intended to limit the scope of the present invention.

The accompanying drawings are selected only to illustrate the embodiments of the present invention. Each element and its shape may be schematically or exaggeratedly illustrated to help the understanding of the present invention. Some elements provided for a real product may not be illustrated or may be omitted in the drawings or the description. The drawings should be construed to help the understanding of the present invention. Like reference numerals may refer to like elements in the specification.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "lower", "upper," and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "connected to", "coupled to", or "adjacent to" another element or layer, it can be directly on, connected to, coupled to, or adjacent to the other element or layer, or one or more intervening elements or layers may be present. When an element or layer is referred to as being "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

The terms "comprises," "comprising," "includes," and/or "including," when used in this specification, may specify the presence of stated features, integers, steps, operations, elements, and/or components, but do not preclude the presence or addition of one or more other features, integers, steps, operations, elements, and/or components.

It will be understood that when an element is referred to as being "on", "over", "located on", "located over", "deposited on", or "deposited over" another element, it can be directly on or over the other element or intervening elements may also be present. Further, the use of "may" when describing embodiments of the present invention refers to "one or more embodiments of the present invention."

Hereinafter, a first embodiment of the present invention will be described with reference to FIGS. 1 to 3.

FIG. 1 is a plan view illustrating a display device, according to the first embodiment of the present invention. FIG. 2 is an enlarged partial view of part "A" of FIG. 1. FIG. 3 is a cross-sectional view taken along the line I-I in FIG. 2.

As illustrated in FIG. 1, an organic light emitting diode (OLED) display 100, according to the first embodiment, includes a substrate 110 having a display area 101 and a non-display area 102.

The display area 101 of the substrate 110 may include a plurality of pixels so as to display an image.

A common electrode line 230 may be located in the non-display area 102. The common electrode line 230 may be spaced apart from the display area 101 and may be located along an edge of the display area 101. At least one protective layer 240 may be located on an edge portion of the common electrode line 230, which is opposite to the display area 101.

Further, a sealing area 220 may be located further out (e.g., more outwards) than the common electrode line 230.

The display area 101 may include an organic light emitting diode (OLED) 210 serving as a display element and thin film transistors (TFTs) 10 and 20 configured to drive the OLED 210.

Figure 2:
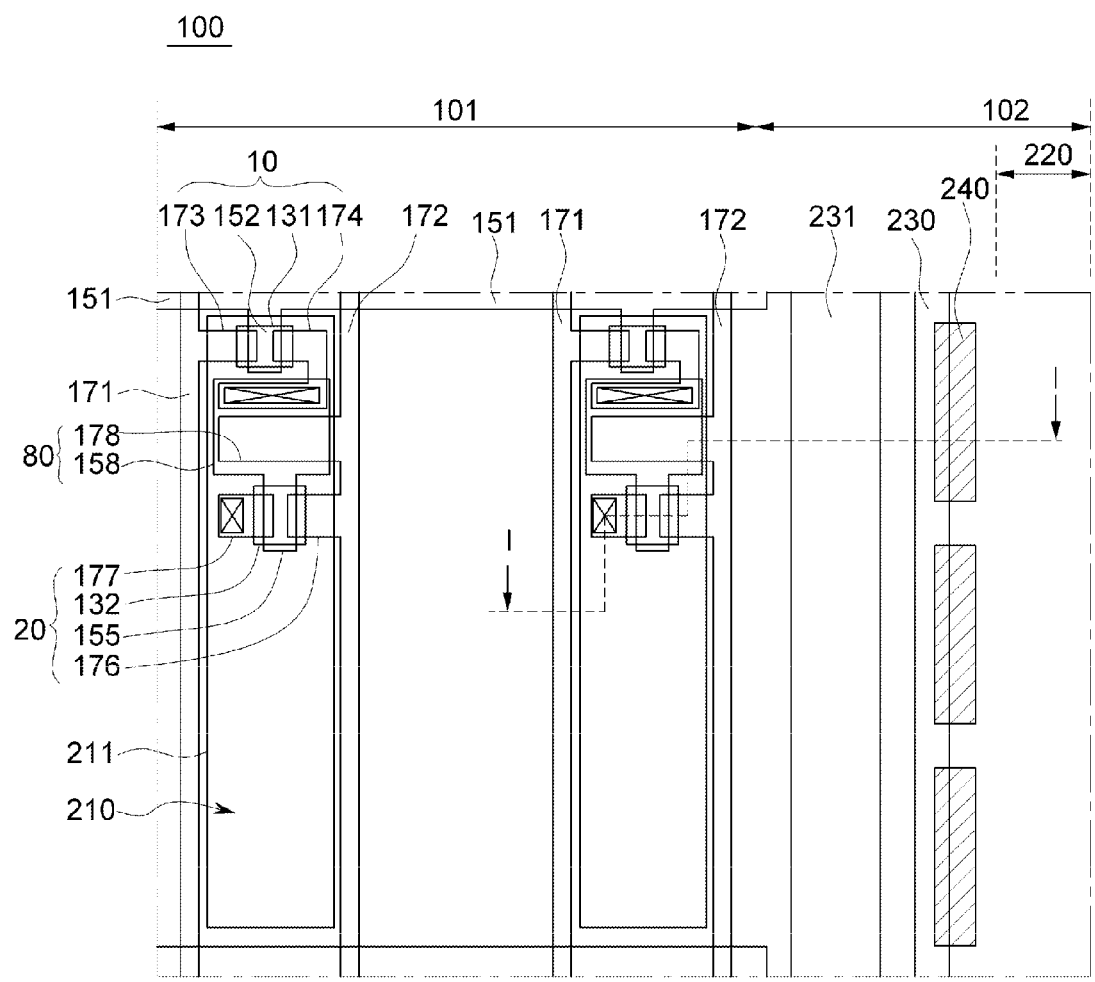
FIG. 2 is an enlarged partial view of part "A" of FIG. 1.
Figure 3:
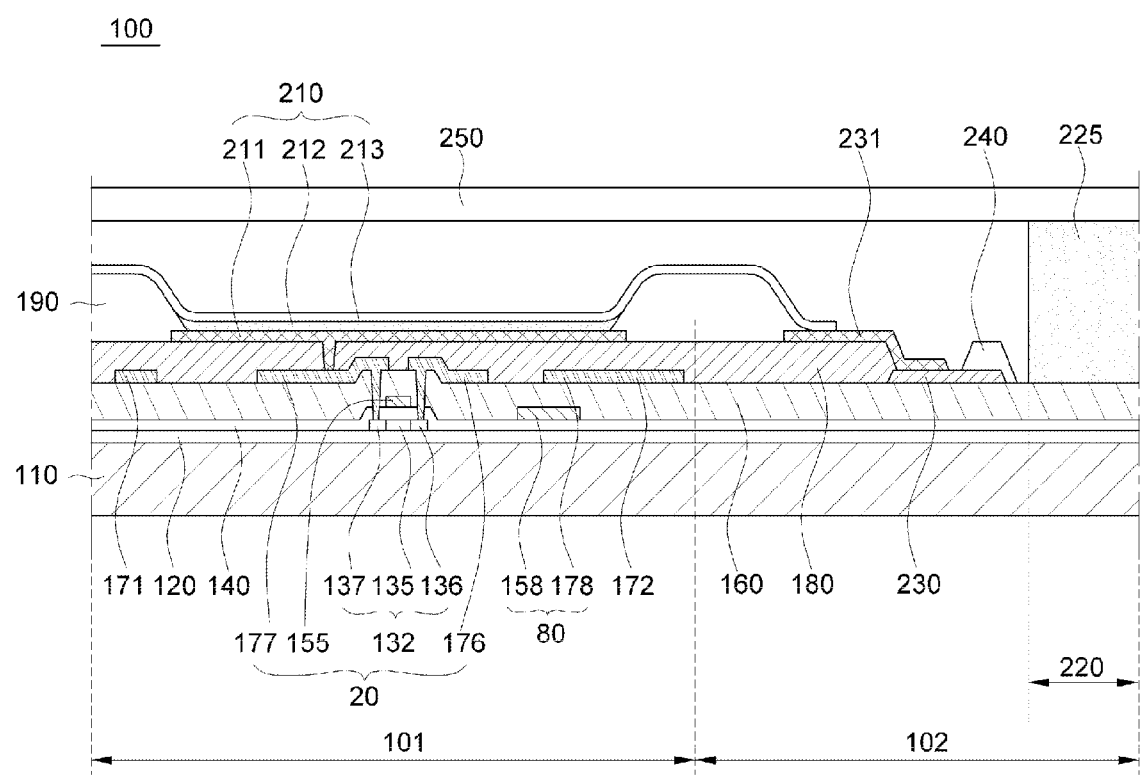
FIG. 3 is a cross-sectional view taken along the line I-I in FIG. 2.

Referring to FIGS. 2 and 3, the OLED display 100, according to the first embodiment, includes a plurality of pixels that are located in the display area 101 and include switching TFTs 10, driving TFTs 20, capacitors 80, and the OLEDs 210. Herein, the term "pixel" refers to the smallest unit for displaying an image and the OLED display 100 displays an image utilizing a plurality of pixels.

Although FIG. 2 illustrates an OLED display with a 2Tr-1Cap structure, which includes two TFTs 10 and 20 and a capacitor 80 in one pixel, embodiments of the present invention are not limited thereto. The OLED display, according to one embodiment, includes three or more TFTs and two or more capacitors in one pixel, and may further include conductive lines. The OLED display, according to one embodiment, may have many different structures.

The OLED display 100 may further include a gate line 151 on the substrate 110, and a data line 171 and power line 172, which are insulated from and crossing the gate line 151. A pixel is usually defined by the gate line 151, the data line 171, and the power line 172, although, it may be differently defined. For example, the pixel may be defined by a black matrix or a pixel defining layer (PDL).

The substrate 110 may be an insulating substrate made of glass, quartz, ceramic, plastic, or the like; however, embodiments of the present invention are not limited thereto. For example, the substrate 110 may be a metal substrate made of stainless steel, or any other suitable material known to those skilled in the art.

A buffer layer 120 may be located on the substrate 110. The buffer layer 120 may reduce or prevent infiltration of undesirable elements such as impurities and moisture and may provide a planar surface. The buffer layer 120 may be made of a suitable material for planarizing and/or preventing infiltration. For example, the buffer layer 120 may include one or more of silicon nitride ($SiN_x$), silicon oxide ($SiO_2$), or silicon oxynitride ($SiO_xN_y$). In an embodiment, the buffer layer 120 may be omitted depending on kinds and process conditions of the substrate 110.

Switching and driving semiconductive layers 131 and 132 may be located on the buffer layer 120. The switching and driving semiconductive layers 131 and 132 may be made of one or more of, e.g., polycrystalline silicon, amorphous silicon, and an oxide semiconductor, such as, indium gallium zinc oxide (IGZO) and indium zinc tin oxide (IZTO). For example, in the example of the driving semiconductive layer 132 illustrated in FIG. 3 made of polycrystalline silicon, the driving semiconductive layer 132 may include a channel area 135 that is not doped with impurities, and p+ doped source and drain areas 136 and 137 on the respective sides of the channel area 135. In this example, p-type impurities such as boron B may be used as dopant ions. For example, $B_2H_6$ may be used. Such impurities may vary depending on kinds of the TFTs. According to the first embodiment of the present invention, a PMOS-structured TFT using the p-type impurities is utilized as the driving TFT 20; however, embodiments of the present invention are not limited thereto. For example, an NMOS-structured or CMOS-structured TFT may also be used as the driving TFT 20.

A gate insulating layer 140 may be located on the switching and driving semiconductive layers 131 and 132. The gate insulating layer 140 may include one or more of, for example, tetraethyl orthosilicate (TEOS), silicon nitride ($SiN_x$), and silicon oxide ($SiO_2$). In an embodiment, the gate insulating layer 140 may have a double layer structure in which a silicon nitride layer having a thickness of about 40 nm and a TEOS layer having a thickness of about 80 nm are sequentially laminated.

A gate wire that includes gate electrodes 152 and 155 (e.g., switching gate electrode 152 and driving gate electrode 155) may be located on the gate insulating layer 140. The gate wire may further include a gate line 151, a first capacitor plate 158, and other conductive lines. The gate electrodes 152 and 155 may be located to overlap at least part of the semiconductive layers 131 and 132, e.g., to overlap the channel area. The gate electrodes 152 and 155 may substantially prevent (e.g., prevent) the channel area from being doped with impurities when the source and drain areas 136 and 137 of the semiconductive layers 131 and 132 are doped with the impurities in the process of forming the semiconductive layers 131 and 132.

The gate electrodes 152 and 155 and the first capacitor plate 158 may be located on the same layer and may be made of substantially the same metal material. The gate electrodes 152 and 155 and the first capacitor plate 158 may include at least one of molybdenum (Mo), chromium (Cr), and tungsten (W).

An interlayer insulating layer 160 configured to cover the gate electrodes 152 and 155 may be located on the gate insulating layer 140. The interlayer insulating layer 160 may be made of tetraethyl orthosilicate (TEOS), silicon nitride ($SiN_x$), or silicon oxide ($SiO_x$) similar to the gate insulating layer 140; however, embodiments of the present invention are not limited thereto.

A data wire including source electrodes 173 and 176 (e.g., switching source electrode 173 and driving source electrode 176) and drain electrodes 174 and 177 (e.g., switching drain electrode 174 and driving drain electrode 177) may be located on the interlayer insulating layer 160. The data wire may further include a data line 171, a power line 172, a second capacitor plate 178, and other conductive lines. The source electrodes 173 and 176 and the drain electrodes 174 and 177 may be respectively coupled to the source area 136 and the drain area 137 of the semiconductive layers 131 and 132 through a contact opening (e.g., hole) formed in the gate insulating layer 140 and the interlayer insulating layer 160.

Thus, the switching TFT 10 may include the switching semiconductive layers 131, the switching gate electrode 152, the switching source electrode 173, and the switching drain electrode 174, and the driving TFT 20 may include the driving semiconductive layer 132, the driving gate electrode 155, the driving source electrode 176, and the driving drain electrode 177. The configurations of the TFTs 10 and 20 are not limited to the above-described embodiment and may vary according to other suitable configurations understood by those of ordinary skill in the art.

The capacitor 80 may include the first capacitor plate 158 and the second capacitor plate 178 with the interlayer insulating layer 160 interposed therebetween.

The switching TFT 10 may function as a switching device that selects a pixel to perform light emission. The switching gate electrode 152 may be coupled to the gate line 151. The switching source electrode 173 may be coupled to the data line 171. The switching drain electrode 174 may be spaced apart from the switching source electrode 173 and may be coupled to the first capacitor plate 158.

The driving TFT 20 may apply a driving power to a pixel electrode 211 to enable a light emission layer 212 of the OLED 210 in a selected pixel to emit light. The driving gate electrode 155 may be coupled to the first capacitor plate 158. The driving source electrode 176 and the second capacitor plate 178 may be coupled to the power line 172. The driving drain electrode 177 may be coupled to the pixel electrode 211 of the OLED 210 through a contact hole.

The switching TFT 10 may be operated by a gate voltage applied to the gate line 151, and may function to transmit a data voltage applied to the data line 171 to the driving TFT 20. A voltage equivalent to a differential between a common voltage applied to the driving TFT 20 from the power line 172 and the data voltage transmitted from the switching TFT 10 may be stored in the capacitor 80, and a current that corresponds to the voltage stored in the capacitor 80 may flow to the OLED 210 through the driving TFT 20 so that the OLED 210 may emit light.

On the interlayer insulating layer 160 of the non-display area 102, the common electrode line 230 may be located more inward than (e.g., inside) the sealing area 220. The common electrode line 230 may be made of substantially the same material (e.g., the same material) as the source electrodes 173 and 176 and the drain electrodes 174 and 177.

The source electrodes 173 and 176, the drain electrodes 174 and 177, and the common electrode line 230 may be made of a metal material. Examples of the metal material may include molybdenum (Mo), chromium (Cr), tungsten (W), aluminum (Al), and/or copper (Cu), and the metals may be used alone or in combination with each other. The source electrodes 173 and 176, the drain electrodes 174 and 177, and the common electrode line 230 may have a single layer structure or a multilayer structure.

A planarization layer 180 may be located on the interlayer insulating layer 160 and may be configured to cover the data wire (171, 172, 173, 174, 176, 177, and 178). The planarization layer 180 may serve to planarize a surface of the OLED 210 that is located on the planarization layer 180 by eliminating or reducing steps so as to increase light emission efficiency of the OLED 210.

The planarization layer 180 may be made of at least one selected from a polyacrylate resin, an epoxy resin, a phenolic resin, a polyamide resin, a polyimide resin, an unsaturated polyester resin, a polyphenylenether resin, a polyphenylene sulfide resin, and benzocyclobutene (BCB).

Meanwhile, the protective layer 240 may coat at least part of an end portion of the common electrode line 230 adjacent to the sealing area 220. The protective layer 240 may be made of substantially the same material as the planarization layer 180 and may be formed by substantially the same process (e.g., the same process) of forming a pattern as the planarization layer 180.

According to the first embodiment, the OLED display 100 includes at least two protective layers 240 that are spaced apart from each other (e.g., by a predetermined distance). The protective layer 240 may be spaced apart from each other (e.g., by a predetermined distance) along a direction of the common electrode line 230.

A length of the protective layer 240 and a distance between the protective layers 240 adjacent to each other are not strictly limited. The length of the protective layer 240 may be measured along a direction in which the common electrode line 230 extends. A width of the protective layer 240 may be measured in a direction perpendicular to the length of the protective layer 240. The distance between the protective layers 240 may refer to a distance between two neighboring protective layers 240.

The length of the protective layer 240 and the distance between the protective layers 240 may be determined by considering workability of pattern and flowability of a layer-forming material along the protective layer 240. The protective layer 240 may have a length in a range of about 20 μm to about 2000 μm or greater. The distance between the neighboring protective layers 240 may be in a range of about 20 μm to about 2000 μm or greater.

The width of the protective layer 240 may vary depending on the width of the common electrode line 230. The protective layer 240 may have a width in a range of about 20 μm to about 100 μm in consideration of the general width of the common electrode line 230, which is in a range of about 200 μm to about 300 μm. The width of the protective layer 240 may also be greater than 100 μm. The protective layer 240 may have substantially the same height (e.g., the same height) as the planarization layer 180; however, embodiments of the present invention are not limited thereto. For example, the protective layer 240 may have a different height from the planarization layer 180.

Further, the protective layer 240 may not extend to the sealing area 220. When the protective layer 240 extends to the sealing area 220, sealing properties may be reduced.

The pixel electrode 211 of the OLED 210 may be located on the planarization layer 180. The pixel electrode 211 may be coupled to the drain electrode 177 through a contact opening (e.g., hole) of the planarization layer 180.

The pixel electrode 211 may be any one of the following types: a transmissive type, a transflective type, and a reflective type.

A transparent conductive oxide (TCO) may be used to form a transmissive electrode. Examples of the TCO may include indium tin oxide (ITO), indium zinc oxide (IZO), zinc oxide (ZnO), and/or indium oxide ($In_2O_3$).

A metal such as magnesium (Mg), silver (Ag), gold (Au), calcium (Ca), lithium (Li), chromium (Cr), aluminum (Al), and copper (Cu), or alloys thereof may be used to form a transflective electrode and a reflective electrode. In this case, the transflective electrode and the reflective electrode may have different thicknesses. For example, the transflective electrode may have a thickness of about 200 nm or less and the reflective electrode may have a thickness of about 300 nm or greater. As the thickness of the transflective electrode decreases, both light transmittance and resistance may increase. Conversely, as the thickness of the transflective electrode increases, light transmittance may decrease.

The transflective electrode and the reflective electrode may have a multilayer structure that includes a metal layer made of a metal or an alloy thereof and a transparent conductive oxide layer laminated on the metal layer.

According to the kinds of materials included in the pixel electrode 211 and a common electrode 213, the OLED display 100 may be classified into three types: a top emission type; a bottom emission type; and a dual-emission type. According to the first embodiment, the OLED display 100 is a top emission device. That is, the OLED 210 may emit light in a direction of the common electrode 213 so as to display an image. In order to improve light emission efficiency of the OLED display (e.g., top emission OLED display) 100, the pixel electrode 211 may be the reflective electrode. Examples of the reflective electrode may include an electrode having a structure in which a transparent conductive oxide layer made of ITO is laminated on a metal layer made of silver (Ag). The reflective electrode may also have a triple-layered structure in which silver (Ag), ITO, and silver (Ag) are sequentially laminated.

In the meantime, a common electrode coupling portion 231 may be located on the planarization layer 180 of the non-display area 102. The common electrode coupling portion 231 may extend from an upper portion of the planarization layer 180 to the common electrode line 230 so as to allow the common electrode line 230 to have an enlarged contact area. The common electrode coupling portion 231 may have substantially the same composition (e.g., the same composition) and configuration as the pixel electrode 211 and also may be formed by substantially the same process as the pixel electrode 211.

A pixel defining layer (PDL) 190 may be located on the planarization layer 180 so as to define a pixel area by exposing at least part of the pixel electrode 211. The pixel electrode 211 may be located in the pixel area defined by the PDL 190. In this case, the common electrode coupling portion 231 may be partially covered with the PDL 190 and may be partially exposed.

The PDL 190 may be made of a polyacrylate resin, a polyimide resin, and/or the like.

The light emission layer 212 may be located on the pixel electrode 211 in the pixel area and the common electrode 213 may be located on the PDL 190 and the light emission layer 212. The common electrode 213 may be in contact with the common electrode coupling portion 231, and thus it may be electrically connected to the common electrode line 230.

The light emission layer 212 may include a low molecular weight organic material or a high molecular weight organic material. At least one of a hole injection layer (HIL) and a hole transport layer (HTL) may be located between the pixel electrode 211 and the light emission layer 212, and at least one of an electron transport layer (ETL) and an electron injection layer (EIL) may be located between the light emission layer 212 and the common electrode 213.

The common electrode 213 may be formed as a transflective layer. The transflective layer used as the common electrode 213 may be made of at least one metal including magnesium (Mg), silver (Ag), calcium (Ca), lithium (Li), chromium (Cr), aluminum (Al) and copper (Cu). The common electrode 213 may have a multilayer structure that includes a metal layer including at least one of magnesium (Mg), silver (Ag), calcium (Ca), lithium (Li), chromium (Cr), aluminum (Al) and copper (Cu) and a transparent conductive oxide (TCO) layer laminated on the metal layer.

As described above, the OLED 210 may include the pixel electrode 211, the light emission layer 212 on the pixel electrode 211, and the common electrode 213 on the light emission layer 212. Herein, the pixel electrode 211 may serve as an anode, which may be a hole injection electrode, and the common electrode 213 may serve as a cathode, which may be an electron injection electrode. However, embodiments of the present invention are not limited thereto, and, for example, the pixel electrode 211 may be a cathode, and the common electrode 213 may be an anode according to a driving method of the OLED display 100.

A sealing member 250 may be located on a sealing layer 225 so as to cover the driving TFT 20 and the OLED 210. A transparent insulating substrate made of glass or plastic may be utilized as the sealing member 250.

The sealing member 250 may be spaced apart from the substrate 110 by the sealing layer 225 in the sealing area 220. The sealing layer 225 may be made of, for example, sealants or frits.

The first embodiment has been described hereinabove with reference to FIGS. 1 to 3; however, embodiments of the present invention are not limited thereto.

In one embodiment, a thin film encapsulation layer in which organic and inorganic layers are alternately laminated may be located on the OLED 210. In this embodiment, the sealing member 250 and the sealing layer 225 may be omitted. Further, many different conductive lines may be located between and insulated by the sealing layer 225 and the substrate 110 so as to provide signals or power.

Hereinafter, another example of a pixel configuration of the display device according to the first embodiment may be described with reference to FIGS. 4 and 5.

Figure 4:
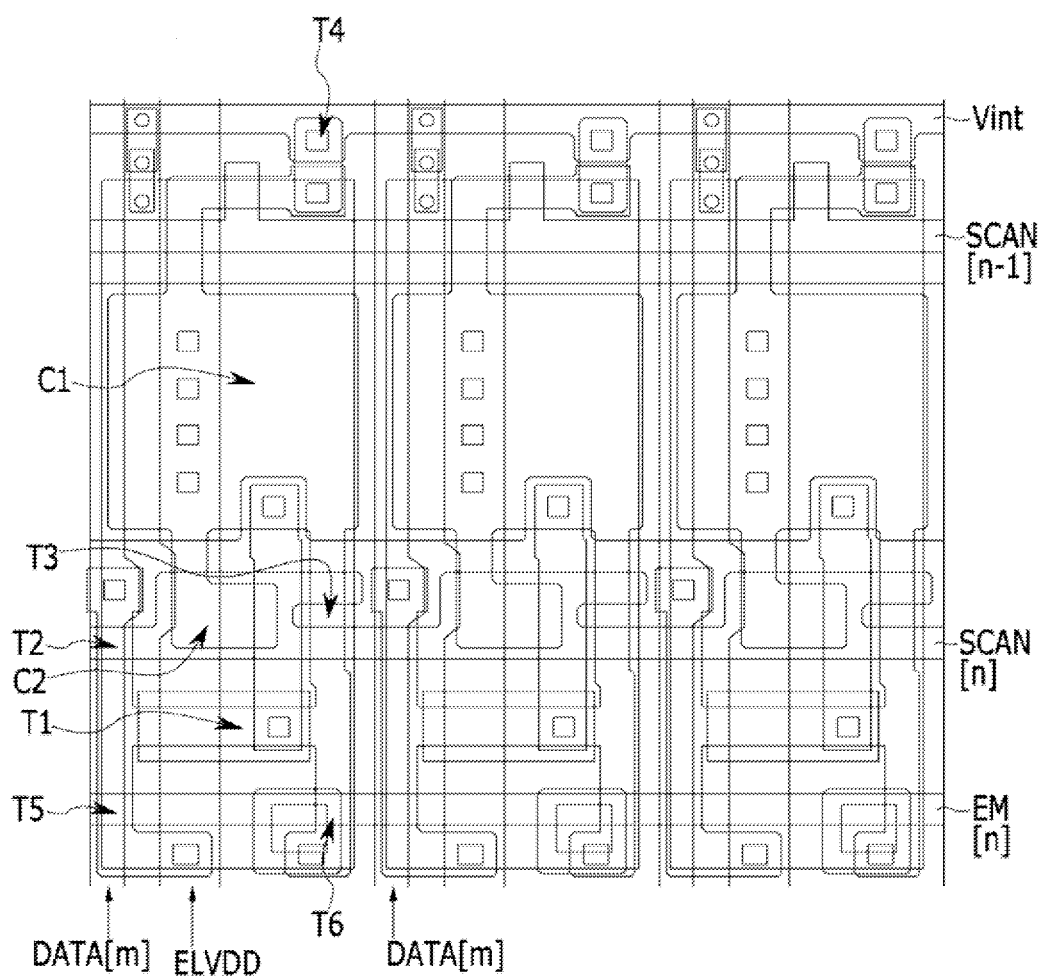
FIG. 4 is another example of an enlarged partial view of part "A" of FIG. 1.
Figure 5:
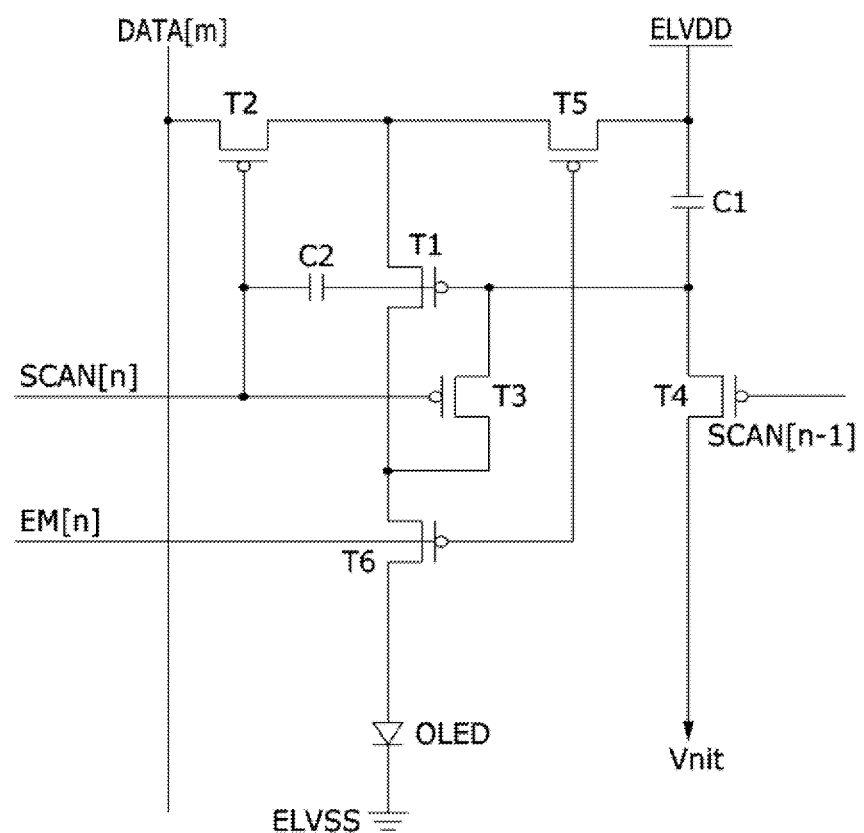
FIG. 5 is an equivalent circuit diagram of a pixel illustrated in FIG. 4.

FIG. 4 is another example of an enlarged partial view of part "A" of FIG. 1 and shows a layout of another embodiment of a pixel included in the OLED display 100 according to the first embodiment.

FIG. 4 illustrates three pixels. FIG. 5 is an equivalent circuit diagram of one pixel illustrated in FIG. 4.

Each pixel illustrated in FIG. 4 may include a driving TFT T1, a switching TFT T2, one or more capacitors C1 and C2, a scan line SCAN[n], a data line DATA[m] (n and m being positive integers), a first power line ELVDD, a second power line ELVSS, and an OLED.

The pixel may also include further scan line SCAN[n−1], emission control line EM[n], initialization voltage line Vint, and TFTs T3, T4, T5, and T6 including a compensation TFT T3. Initialization voltage VIN transmitted through the initialization voltage line Vint may initialize the driving TFT T1.

The switching TFT T2 may be switch-operated according to scan signals transmitted through the scan line SCAN[n]. For example, a gate electrode of the switching TFT T2 may be connected to the scan line SCAN[n]. A source electrode of the switching TFT T2 may be connected to the data line DATA[m]. The scan line SCAN[n] and the data line DATA [m] may be located in a direction intersecting each other. A drain electrode of the switching TFT T2 may be electrically connected to a source electrode of the driving TFT T1 and the first power line ELVDD.

The driving TFT T1 may receive data signals according to a switching operation of the switching TFT T2 so as to transmit a driving current to the OLED.

A gate electrode of the driving TFT T1 may be connected to one electrode of the first capacitor C1. The other electrode of the first capacitor C1 may be connected to the first power line ELVDD.

The first power line ELVDD may be located parallel to the data line DATA[m]. A drain electrode of the driving TFT T1 may be electrically connected to an anode 211 of the OLED. The second power line ELVSS may be connected to a cathode 213 of the OLED. Therefore, the OLED may emit light by receiving the driving current from the driving TFT T1.

The OLED may include the anode 211 that injects holes, the cathode 213 that injects electrons, and the light emission layer 212 that is located between the anode 211 and the cathode 213.

Hereinafter, an operating process for the pixel illustrated in FIG. 4 will be described in more detail with reference to FIG. 5.

First, while the TFT T4 is in the ON state according to scan signals transmitted through the scan line SCAN[n−1], the initialization voltage VIN may be supplied to an end of the first capacitor C1 and the gate electrode of the driving TFT T1.

Next, the switching TFT T2 and the compensation TFT T3 may be turned on according to scan signals transmitted through the scan line SCAN[n]. While the switching TFT T2 and the compensation TFT T3 are in the ON state, a data voltage transmitted through the data line DATA[m] may be transmitted to the source electrode of the driving TFT T1, and the driving TFT T1 may be diode-connected.

Then, a voltage obtained by subtracting a threshold voltage of the driving TFT T1 from the data voltage may be applied to the gate electrode and the source electrode of the driving TFT T1.

Next, the TFTs T5 and T6 may be turned on by emission control signals transmitted through the emission control line EM[n], and a voltage of the gate electrode of the driving TFT T1 may be boosted by an increase of the scan signals transmitted through the scan line SCAN[n].

While the two TFTs T5 and T6 are in the ON state, a voltage of the first power line ELVDD may be supplied to the source electrode of the driving TFT T1, and a driving current according to a gate-source voltage difference may flow to the driving TFT T1. The driving current may be transmitted to the anode of the OLED through the turned-on TFT T6.

Figure 6:
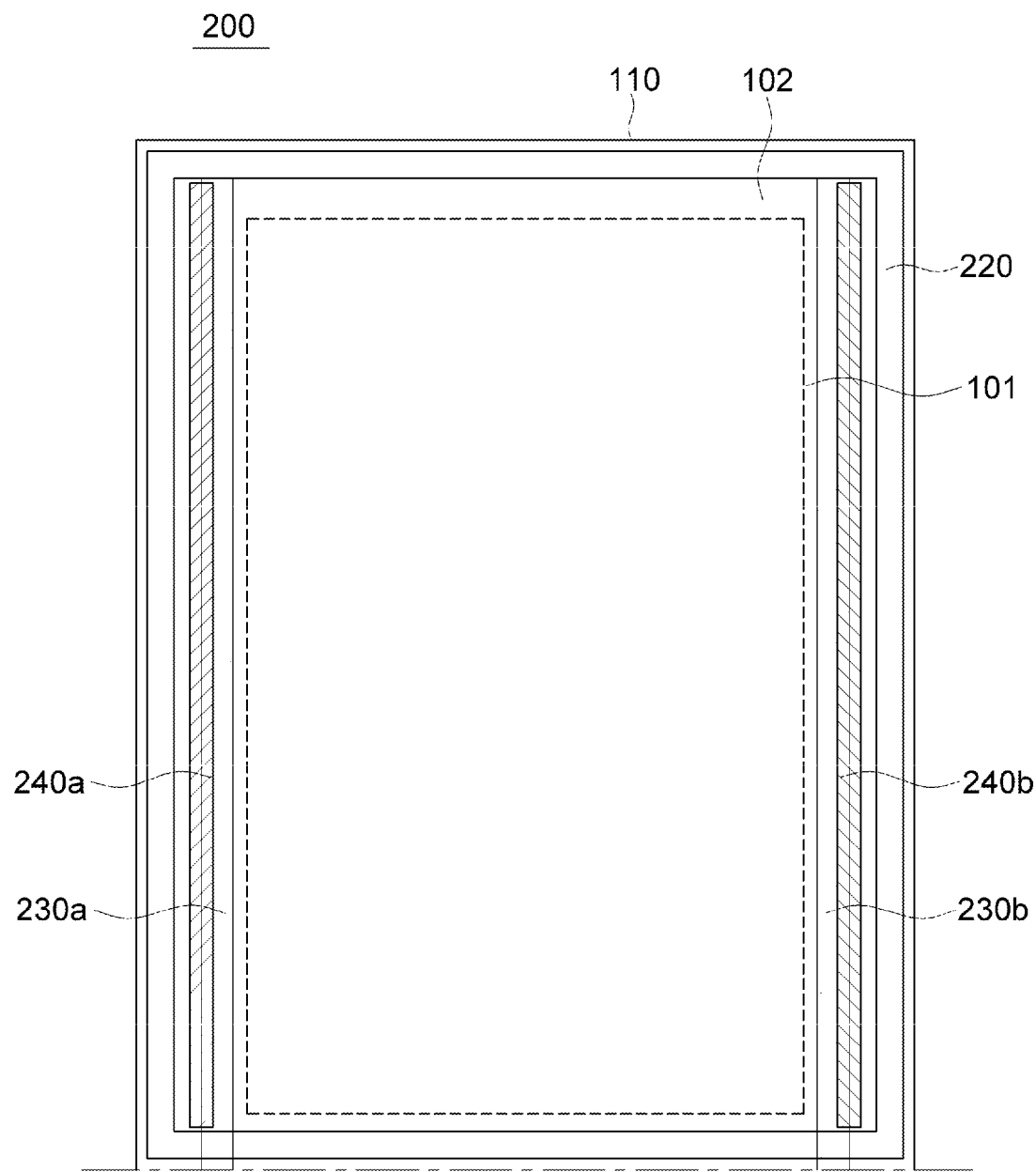
FIG. 6 is a plan view illustrating a display device, according to a second embodiment of the present invention.

Hereinafter, a second embodiment of the present invention will be described with reference to FIG. 6, and in order to avoid repetitions, only differences between the first and second embodiments may be described without repeated descriptions of the components of the first embodiment.

According to the second embodiment, an OLED display 200 includes common electrode lines 230a and 230b on the left and right sides of the display area 101. The OLED display 200 may further include protective layers 240a and 240b configured to coat parts of the common electrode lines 230a and 230b, respectively. In this case, the protective layers 240a and 240b may be as long as a length of one side of the display area 101 or may be longer than the length of one side of the display area 101. The length of the protective layers 240a and 240b may vary depending on the length of the display area 101. The protective layers 240a and 240b may cover one side-edge of the common electrode lines 230a and 230b.

Hereinafter, a third embodiment of the present invention will be described with reference to FIG. 7, and in order to avoid repetitions, only differences between the above-described embodiments and the third embodiment may be described without repeated descriptions of the components of the first embodiment.

Figure 7:
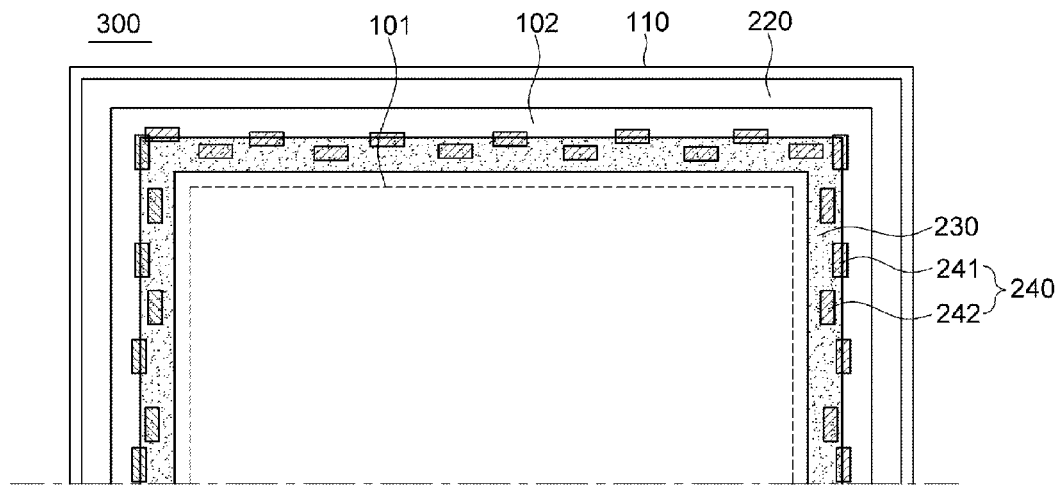
FIG. 7 is a partial plan view illustrating a display device, according to a third embodiment of the present invention.

FIG. 7 is a partial plan view illustrating an OLED display 300, according to the third embodiment of the present invention.

According to the third embodiment, an OLED display 300 includes a first protective layer 241 and a second protective layer 242 located in a zigzag form along the common electrode line 230. The protective layer 240 (241, 242) may coat at least part of an end portion of the common electrode line 230 adjacent to the sealing area 220. In the embodiment, the first protective layer 241 that coats an end portion of the common electrode line 230 adjacent to the sealing area 220 and the second protective layer 242 that does not coat the end portion of the common electrode line 230 may be alternately located on the common electrode line 230.

The first and second protective layers 241 and 242 may have a length in a range of about 20 μm to about 2000 μm or greater respectively. A distance between the first and second protective layers 241 and 242 may be in a range of about 20 μm to about 2000 μm or greater. The first and second protective layers 241 and 242 may have a width in a range of about 20 μm to about 100 μm or the width may be greater than 100 μm respectively.

Figure 8:
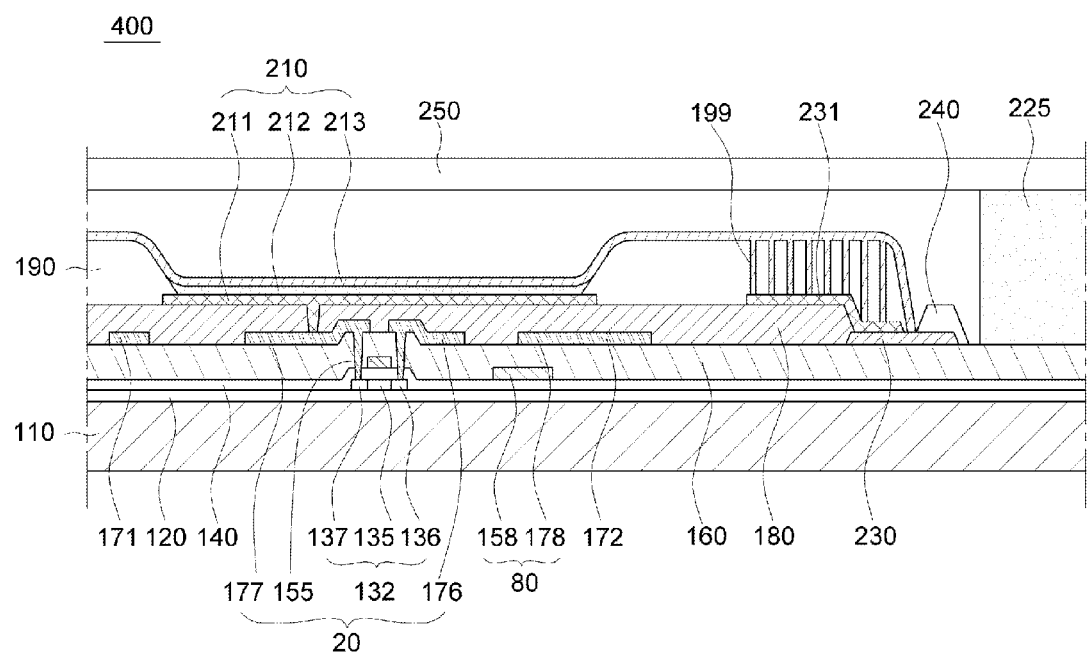
FIG. 8 is a cross-sectional view illustrating a display device, according to a fourth embodiment of the present invention.

Hereinafter, a fourth embodiment of the present invention will be described with reference to FIG. 8, and in order to avoid repetitions, only differences between the above-described embodiments and the fourth embodiment may be described without repeated descriptions of the components of the first embodiment.

According to the fourth embodiment, an OLED display 400 includes a pixel defining layer (PDL) 190 that overlaps the common electrode coupling portion 231 and the common electrode line 230. The PDL 190 may have a contact opening (e.g., hole) 199 formed in a region corresponding to the common electrode coupling portion 231. The common electrode 213 and the common electrode coupling portion 231 may be coupled to each other through the contact opening (e.g., hole) 199, and thus power supplied to the common electrode line 230 may be transmitted to the common electrode 213.

Hereinafter, a method for manufacturing the OLED display 100 according to the first embodiment will be described with reference to FIGS. 9A to 9I. The method for manufacturing the OLED display 100 may include forming a display area 101 and a non-display area 102 on a substrate 110, and a common electrode line 230 and a protective layer 240 may be formed in the non-display area 102.

Figure 9A:
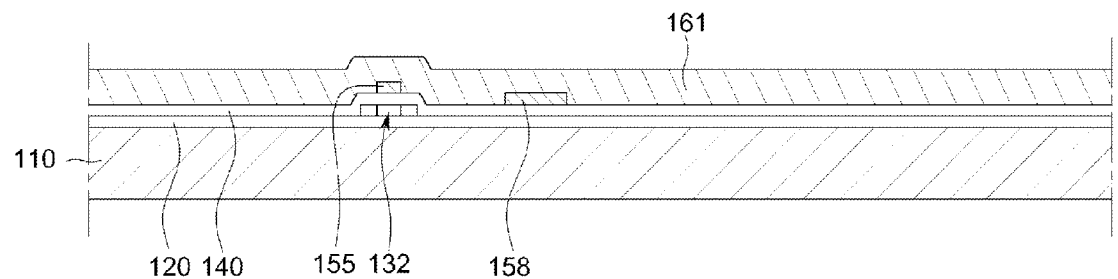
FIGS. 9A to 9I are cross-sectional views illustrating sequential manufacturing processes of the display device, according to the first embodiment of the present invention.

As illustrated in FIG. 9A, a buffer layer 120 may be formed on the substrate 110 made of glass or plastic, a semiconductive layer 132 may be formed on the buffer layer 120, a gate insulating layer 140 may be formed on the semiconductive layer 132, a gate wire including a gate electrode 155 and a first capacitor plate 158 may be formed on the gate insulating layer 140, and an interlayer insulating layer-forming material may be applied to the gate wire so as to form a material layer 161 for an interlayer insulating layer.

Figure 9B:
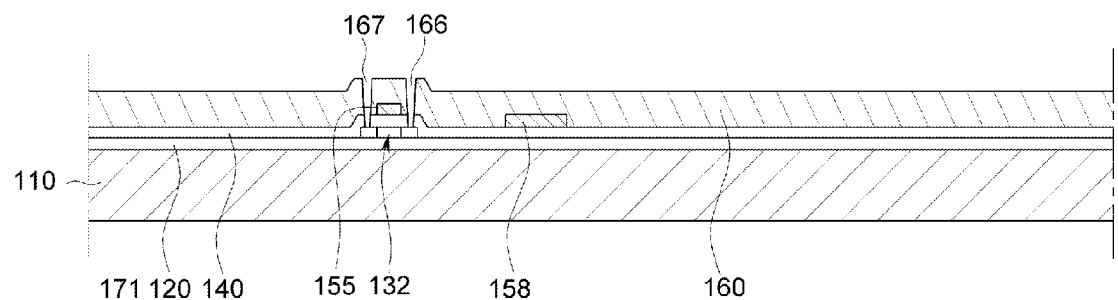

Next, as illustrated in FIG. 9B, the material layer 161 for (e.g., making up) an interlayer insulating layer 160, and the gate insulating layer 140 may be partially removed to form a source contact opening (e.g., hole) 166 and a drain contact opening (e.g., hole) 167 that allows parts of source and drain areas of the semiconductive layer 132 to be exposed.

Figure 9C:
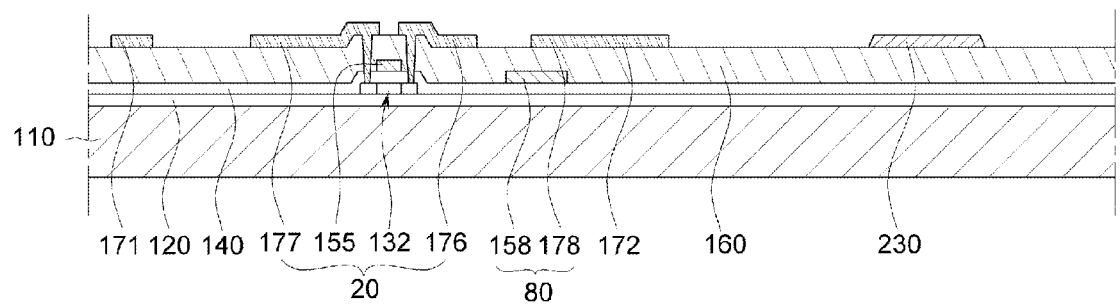

Next, as illustrated in FIG. 9C, a source electrode 176 and a drain electrode 177 that are coupled to the semiconductive layer 132 through the source contact opening (e.g., hole) 166 and the drain contact opening (e.g., hole) 167 may be formed, and a data line 171, a second capacitor plate 178, and a power line 172 may also be formed such that a data wire may be formed. In addition, the common electrode line 230 may be formed on an interlayer insulating layer 160 of the non-display area 102. The common electrode line 230 may be formed of substantially the same material as the source and drain electrodes 176 and 177 by substantially the same process as the source and drain electrodes 176 and 177.

Figure 9D:
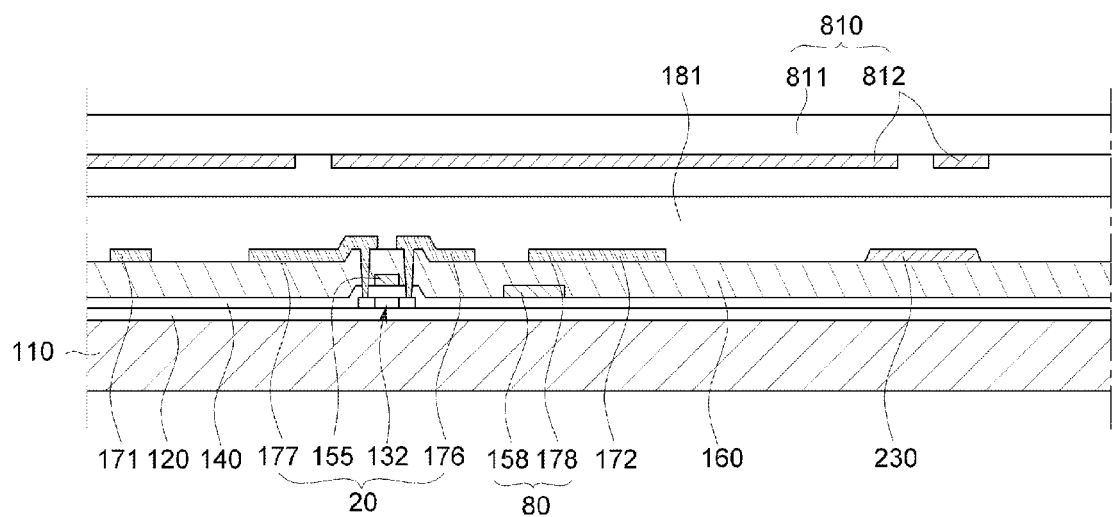

Next, as illustrated in FIG. 9D, a planarization layer-forming material may be applied to the data wire and the common electrode line 230 so as to form a material layer 181 for a planarization layer, and then photolithography may be performed utilizing a pattern mask 810. In other words, the pattern mask 810 is utilized to perform photolithography on the material layer 181 to form the planarization layer. Examples of the planarization layer-forming material may include silicon nitride ($SiN_x$), silicon oxide ($SiO_2$), or a photosensitive resin.

The pattern mask 810 may include a mask substrate 811 and a light-shielding pattern 812 on the mask substrate 811. An exposed part of the material layer 181 for a planarization layer may be removed in a developing process and a non-exposed part of the material layer 181 for a planarization layer may remain after the developing process. In this case, according to the kind of the planarization layer-forming material, the exposed part may remain and the non-exposed part may be removed.

Figure 9E:
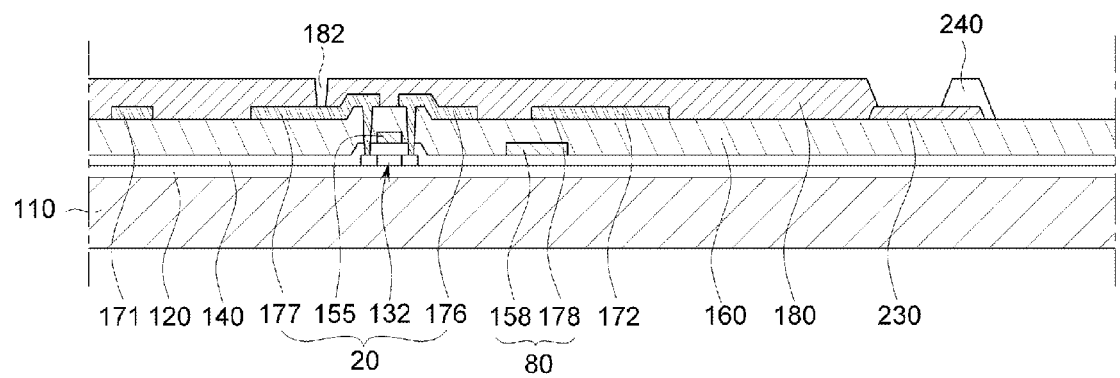

Next, as illustrated in FIG. 9E, a planarization layer 180 having a pixel contact opening (e.g., hole) 182 and the protective layer 240 may be formed through developing and curing processes. The curing process may include thermal curing or photocuring. The planarization layer 180 and the protective layer 240 may become stable layers through the curing process. The planarization layer 180 may cover an end portion of the common electrode line 230, which is located towards the display area 101, and the protective layer 240 may cover an end portion of the common electrode line 230, which is located towards the sealing area 220.

Figure 9F:
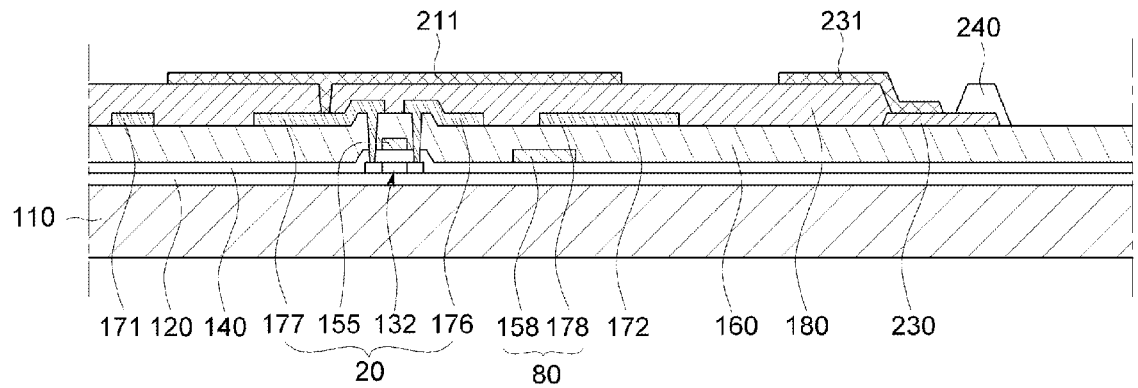

As illustrated in FIG. 9F, a pixel electrode 211 and a common electrode coupling portion 231 coupled to the common electrode line 230 may be formed on the planarization layer 180. The pixel electrode 211 may be coupled to the drain electrode 177 of a driving TFT 20 through the pixel contact opening (e.g., hole). The common electrode coupling portion 231 may be formed of substantially the same material as the pixel electrode 211 by substantially the same process as the pixel electrode 211.

In one embodiment, the pixel electrode 211 and the common electrode coupling portion 231 may be formed by a method including forming a conductor material layer by forming a metal layer on the planarization layer 180 and the common electrode line 230, and laminating a transparent conductive oxide layer on the metal layer, and patterning the conductor material layer.

Figure 9G:
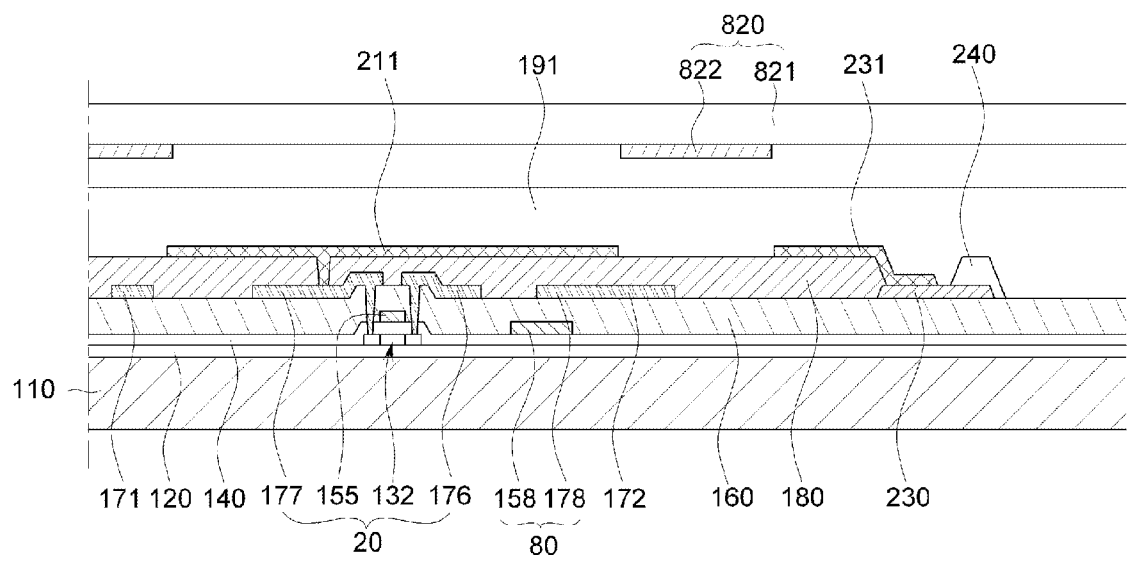

Next, as illustrated in FIG. 9G, a photosensitive organic material may be applied to the entire surfaces of the pixel electrode 211, the common electrode coupling portion 231, the common electrode line 230, and the exposed planarization layer 180 so as to form an organic material layer 191 for a pixel defining layer, and then photolithography may be performed utilizing a pattern mask 820. In other words, the pattern mask 820 is utilized to perform photolithography on the material layer 191 to form the pixel defining layer.

Examples of the photosensitive organic material may include polyacrylate resins and polyimide resins. In order to form the organic material layer 191 for a pixel defining layer, a slit nozzle may be used to apply the photosensitive organic material such as polyacrylate resins and polyimide resins. The protective layer 240 may be formed on the common electrode line 230, and thus the photosensitive organic material may not be gathered in an end portion of the common electrode line 230 and may easily flow out. As a result, the organic material layer 191 for a pixel defining layer may be formed in a uniform way.

The pattern mask 820 may include a mask substrate 821 and a light-shielding pattern 822 on the mask substrate 821. An exposed part of the organic material layer 191 for a pixel defining layer may be removed in a developing process and a non-exposed part thereof may still remain after the developing process.

Figure 9H:
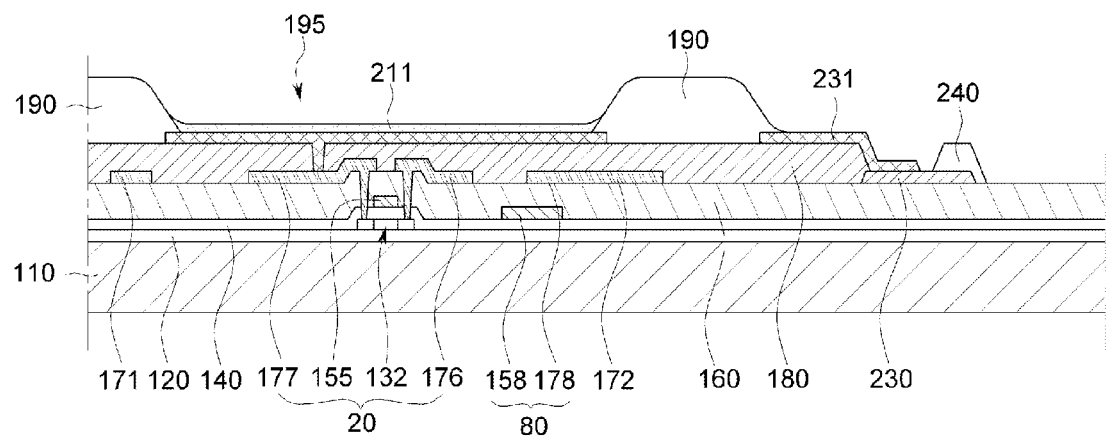

Next, as illustrated in FIG. 9H, a pixel defining layer (PDL) 190 having an opening 195 may be formed through the developing process. The PDL 190 may become a stable layer by thermal curing or photocuring. The opening 195 of the PDL 190, which is formed on the pixel electrode 211, may correspond to a pixel area. Further, the common electrode coupling portion 231 may be exposed partially.

Figure 9I:
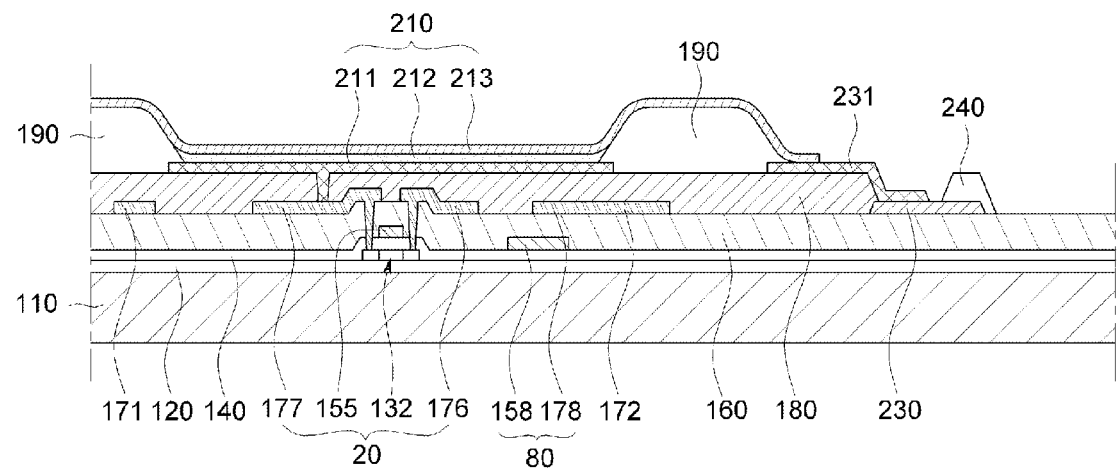

Next, as illustrated in FIG. 9I, a light emission layer 212 may be formed on the pixel electrode 211 that is exposed through the opening 195 of the PDL 190, and a common electrode 213 may be formed on the light emission layer 212 and the PDL 190. The common electrode 213 may be in contact with the common electrode coupling portion 231.

Thereafter, a sealing member 250 may be formed on the common electrode 213 such that the OLED display 100 may be manufactured as illustrated in FIG. 3.

Hereinafter, reasons for forming the protective layer 240 may be described with reference to FIGS. 10A and 10B.

Figure 10A:
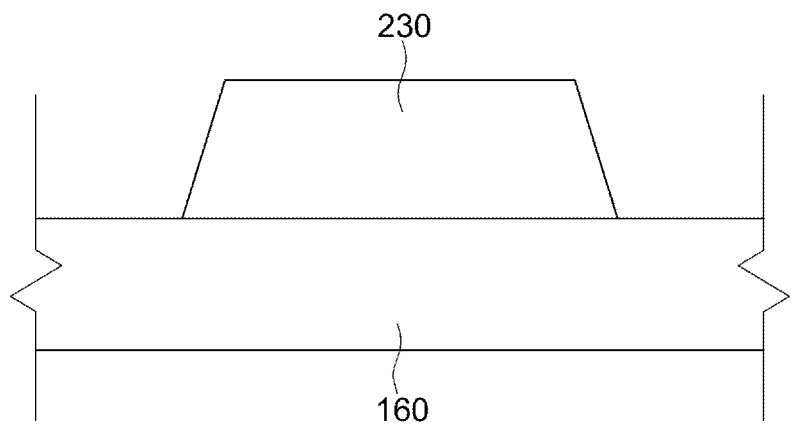
FIGS. 10A and 10B are cross-sectional views illustrating a common electrode line.
Figure 10B:
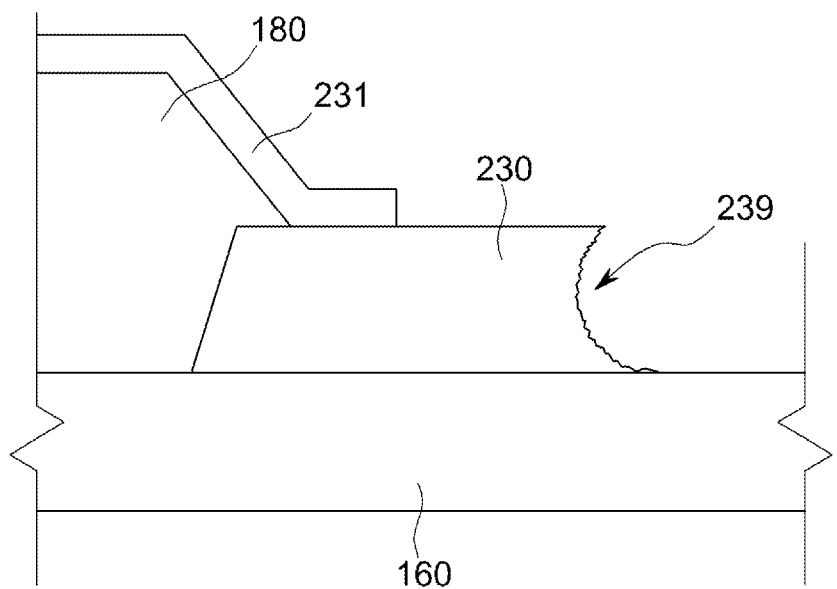

FIG. 10A is a cross-sectional view illustrating the common electrode line 230 on the interlayer insulating layer 160. The common electrode line 230 formed with the data wire may have a positive tapered cross-section as illustrated in FIG. 10A.

The common electrode line 230 may be formed of a metal and the planarization layer 180 may be formed only on one end portion (left side) of the common electrode line 230 (see FIG. 9B). Meanwhile, developing may be performed in the process of forming the planarization layer 180 on the interlayer insulating layer 160 after the common electrode line 230 is formed, and developing and etching may be performed in the process of forming the pixel electrode 211 and the common electrode coupling portion 231 on the planarization layer 180. While the developing and etching are repeatedly performed, the exposed end portion (right side) of the common electrode line 230 is likely to be damaged. As a result, the exposed end portion of the common electrode line 230 may have an inverse-tapered shape 239 as illustrated in FIG. 10B.

Figure 11:
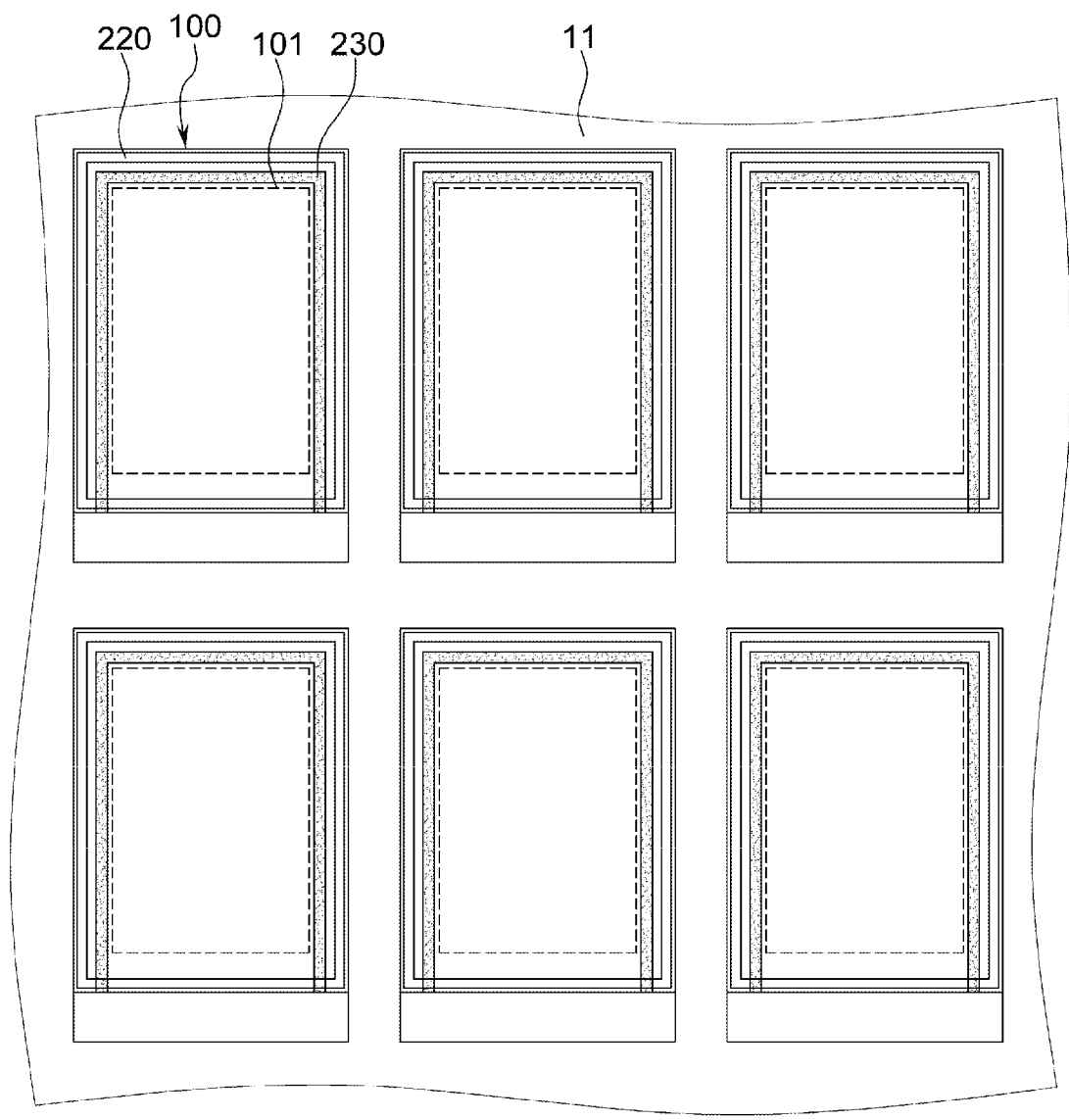
FIG. 11 is a plan view illustrating a mother glass for manufacturing a display device.

Further, in order to form the PDL 190, the photosensitive organic material may be applied to the pixel electrode 211 and the common electrode line 230. In this case, the photosensitive organic material may not be gathered in a region and may flow uniformly so as to form the smooth PDL 190. As illustrated in FIG. 11, in a process of manufacturing a plurality of display devices 100 utilizing one mother glass 11, the photosensitive organic material applied to the entire mother glass 11 may flow uniformly on the mother glass 11.

In the case where an end portion of the common electrode line 230 has a positive tapered shape as illustrated in FIG. 10A, the photosensitive organic material may easily flow down a slope of the end portion of the common electrode line 230. However, when the end portion of the common electrode line 230 is damaged and thus, has an inverse-tapered shape 239 as illustrated in FIG. 10B, the photosensitive organic material may not easily flow down the damaged end portion of the common electrode line 230 and may be concentrated in the end portion of the common electrode line 230. Therefore, a step may occur in the organic material layer 191 for a pixel defining layer.

Figure 12:
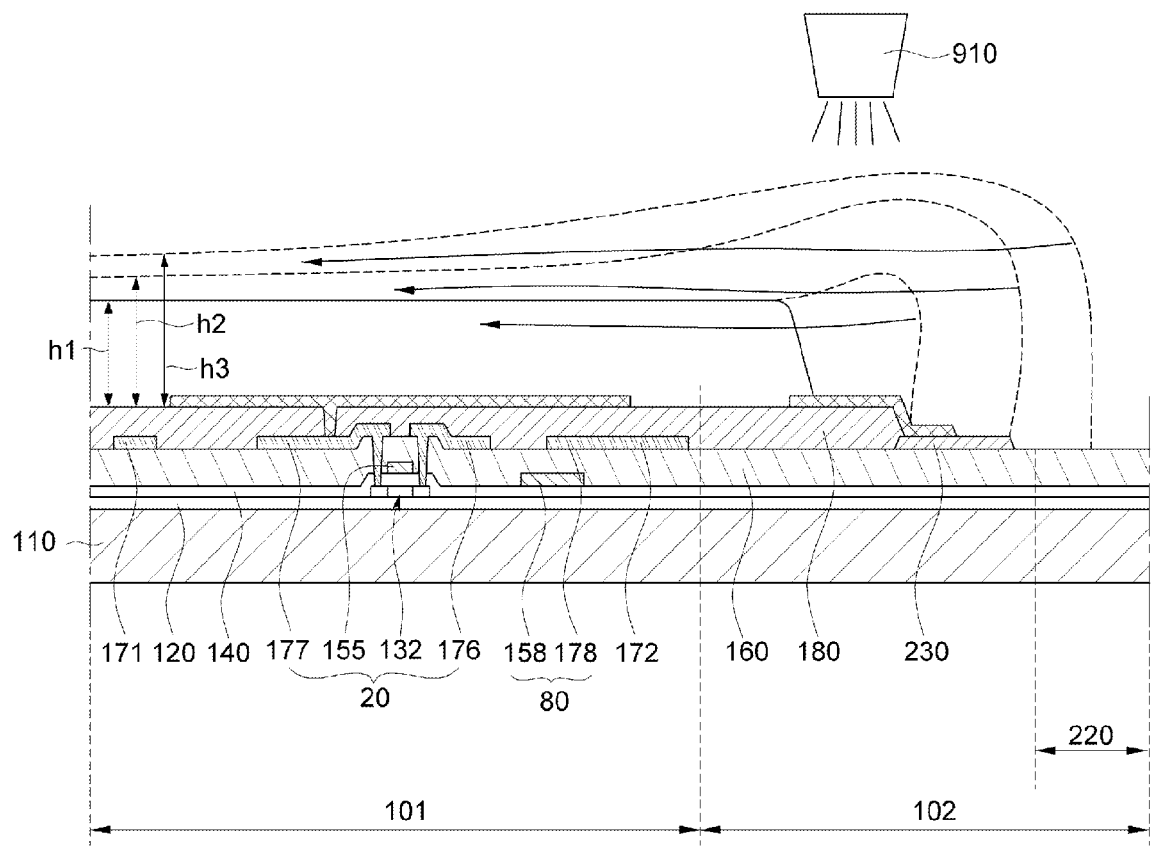
FIG. 12 is a cross-sectional view illustrating application of an organic material for forming a pixel defining layer.

FIG. 12 is a cross-sectional view illustrating application of the organic material for a pixel defining layer. As illustrated in FIG. 12, when a photosensitive organic material supplied from a nozzle 910 fails to easily flow down an end portion of the common electrode line 230, the photosensitive organic material may be accumulated in the end portion of the common electrode line 230 and the accumulated photosensitive organic material may reversely flow towards the display area 101 as marked with arrows. As described above, when the photosensitive organic material is accumulated in the end portion of the common electrode line 230, a height of the photosensitive organic material, which, in some examples may be h1, may become h2 or h3. Until the height of the photosensitive organic material becomes h2 or h3, the photosensitive organic material accumulated in the end portion of the common electrode line 230 may not flow to an adjacent region, and then a step may occur in the organic material layer for a pixel defining layer. Therefore, the pixel defining layer may fail to be formed to have a uniform layer thickness. Accordingly, the OLED display 100 may have poor quality in light emission.

According to some embodiments of the present invention, when an end portion of the common electrode line 230 is coated with the protective layer 240, a photosensitive organic material may easily flow through the protective layer 240, and thus, it may be accumulated to have a suitable height in the end portion of the common electrode line 230. Consequently, a flat or smooth layer may be obtained.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. A display device comprising:
   a substrate comprising a display area and a non-display area;
   a common electrode line in the non-display area;
   a common electrode coupling portion coupled to the common electrode line; and
   a plurality of spaced apart protective layers,
   wherein each of the spaced apart protective layers covers a portion of the common electrode line,
   wherein a width of the plurality of protective layers along a direction perpendicular to an arrangement direction of the protective layers is less than that of the common electrode line,
   wherein the display area comprises at least one transistor and at least one display element, wherein the display element comprises a pixel electrode on the substrate, a light emission layer on the pixel electrode, and a common electrode on the light emission layer,
   wherein the common electrode of the display element and the common electrode coupling portion are each spaced apart from the plurality of protective layers in a plan view, and
   wherein the non-display area surrounds the display area.

2. The display device of claim 1, wherein the common electrode line comprises a metal.

3. The display device of claim 1, wherein the at least one transistor of the display area comprises at least one thin film transistor comprising a gate electrode, a semiconductive layer, a source electrode, and a drain electrode, and wherein the common electrode line comprises substantiality the same material as the source and drain electrodes.

4. The display device of claim 1, wherein the plurality of protective layers overlaps with one side-edge of the common electrode line.

5. The display device of claim 4, wherein a length of the plurality of protective layers is greater than or equal to a length of one side of the display area.

6. The display device of claim 1, wherein the plurality of protective layers comprise a first protective layer and a second protective layer that are separated from each other along a direction of the common electrode line.

7. The display device of claim 6, wherein a distance between the first protective layer and the second protective layer is in a range of about 20 μm to about 2000 μm.

8. The display device of claim 6, wherein the first protective layer and the second protective layer are arranged in a zigzag form along the common electrode line.

9. The display device of claim 1, wherein each of the plurality of protective layers has a width in a range of about 20 μm to about 200 μm.

10. The display device of claim 1,
    wherein the common electrode is coupled to the common electrode line.

11. The display device of claim 10, wherein the display area further comprises a planarization layer between the substrate and the pixel electrode, and wherein the plurality of protective layers comprise substantially the same material as the planarization layer.

12. The display device of claim 11, further comprising a pixel defining layer on the planarization layer so as to define a pixel area,
    wherein the pixel electrode and the light emission layer are located in the pixel area.

13. The display device of claim 11, wherein the common electrode coupling portion is located on the planarization layer.

14. The display device of claim 13, wherein the common electrode coupling portion comprises substantially the same material as the pixel electrode.

15. The display device of claim 1, wherein the portion of the common electrode line is an end portion of the common electrode line.

16. The display device of claim 15, wherein the end portion of the common electrode line is located away from the display area.

17. The display device of claim 15, wherein the protective layers comprise a first protective layer and a second protective layer that are separated from each other along a direction of the common electrode line.

18. The display device of claim 17, wherein the first protective layer and the second protective layer are alternately arranged in a zigzag form along the common electrode line.

19. The display device of claim 17, wherein the first protective layer covers the end portion of the common electrode line.

20. The display device of claim 19, wherein the second protective layer does not cover the end portion of the common electrode line.

* * * * *